United States Patent
Hauser et al.

(10) Patent No.: US 7,449,812 B2
(45) Date of Patent: Nov. 11, 2008

(54) ELECTROACOUSTIC TRANSDUCER FOR A SURFACE WAVE OPERATING COMPONENT

(75) Inventors: Markus Hauser, Feldafing (DE); Ulrike Roesler, Hebertshausen (DE); Werner Ruile, Munich (DE)

(73) Assignee: EPCOS AG, Munich (DE)

( * ) Notice: Subject to any disclaimer, the term of this patent is extended or adjusted under 35 U.S.C. 154(b) by 100 days.

(21) Appl. No.: 10/547,852

(22) PCT Filed: Dec. 16, 2003

(86) PCT No.: PCT/EP03/14353

§ 371 (c)(1),
(2), (4) Date: Sep. 1, 2005

(87) PCT Pub. No.: WO2004/079903

PCT Pub. Date: Sep. 16, 2004

(65) Prior Publication Data

US 2006/0158061 A1 Jul. 20, 2006

(30) Foreign Application Priority Data

Mar. 3, 2003 (DE) .......................... 103 09 250

(51) Int. Cl.
*H01L 41/08* (2006.01)
(52) U.S. Cl. .................................. 310/313 B
(58) Field of Classification Search ............. 310/313 A, 310/313 B, 313 R, 313 C, 313 D; 333/193–196; H01L 41/08, 41/10; H03H 09/02
See application file for complete search history.

(56) References Cited

U.S. PATENT DOCUMENTS

| | | | | |
|---|---|---|---|---|
| 3,699,364 A | * | 10/1972 | Gerard | ............... 310/313 C |
| 3,835,422 A | * | 9/1974 | Hartemann | ............... 333/196 |
| 4,007,433 A | * | 2/1977 | Houkawa et al. | ........ 310/313 R |
| 4,406,964 A | | 9/1983 | Chiba et al. | |
| 4,760,360 A | | 7/1988 | Grassl et al. | |

FOREIGN PATENT DOCUMENTS

| WO | WO 03/012987 | | 2/2003 |
|---|---|---|---|
| WO | WO 03012987 | * | 2/2003 |

OTHER PUBLICATIONS

Hohkawa et al., "Surface Acoustic Wave Filters without Apodization Loss," Electronics and Communications in Japan, Scripta Technica, New York, US, Bd. 62-A, Nr. 2, Jan. 2, 1979, pp. 10-17.

* cited by examiner

*Primary Examiner*—Thomas M. Dougherty
*Assistant Examiner*—Karen B Addison
(74) *Attorney, Agent, or Firm*—Fish & Richardson P.C.

(57) ABSTRACT

An electroacoustic transducer includes a first electrode having first fingers connected to a first bus bar, and a second electrode having second fingers connected to a second bus bar. The first and second fingers interdigitate and terminate at ends. The ends of the first and second fingers abut gaps between the first and second electrodes. An acoustic wave of wavelength λ is excitable at a resonant frequency. The acoustic wave has a longitudinal and a transverse excitation profile and a longitudinal and a transverse energy density profile, where the longitudinal excitation profile is approximately constant and different from the longitudinal energy density profile, and the transverse excitation profile substantially corresponds to the transverse energy density profile. Transverse positions of the gaps relative to the first and second bus bars vary to substantially correspond to the transverse excitation profile across the gaps.

24 Claims, 7 Drawing Sheets

ELECTROACOUSTIC TRANSDUCER FOR A SURFACE WAVE OPERATING COMPONENT

TECHNICAL FIELD

The invention relates to an electroacoustic transducer for a component operating with surface waves.

BACKGROUND

An electroacoustic transducer generally comprises two comb-like electrodes arranged on a piezoelectric substrate, with interlocking fingers, generally arranged on a periodic grid. An electrical signal applied to the electrodes excites an acoustic surface wave if the signal frequency corresponds to the period of the finger structure.

The characteristics of an electroacoustic transducer are essentially predetermined by the number, width, connection sequence and longitudinal position (i.e., position along the propagation of the acoustic wave) of the fingers, as well as by the aperture (i.e., the length of the active overlap region of the adjacently arranged fingers of different electrodes). These are generally selected so that, if possible, only one acoustic vibration mode is excited, against which the design is optimized in terms of said variable parameters.

Electroacoustic transducers for surface wave components are especially used in the development of reactance filters.

Single-gate resonators are known, for example, that include a transducer delimited on one side by reflectors. Also known are DMS filters (Double Mode Surface Acoustic Wave Filter) and multiple gate resonators with several transducers that are acoustically connected to one another. Filters with SPUDT transducers (Single Phase Unidirectional Transducer) with a preferred emission direction of the acoustic wave are also known.

Also known are weighted transverse filters that include transducers with a transverse overlapping profile of the electrode fingers. In this context, the overlapping profile is utilized to structure the impulse excitation within the time range, which is ideally to deliver a rectangular pass-through band of the transmission function.

An important parameter of the reactance filters is the input attenuation, which corresponds to the maximum attenuation of a signal passing through the filter in the pass-through band. Anything that increases the input attenuation worsens the transmission characteristics of the overall system, so that the lowest possible losses are also considered desirable in this case.

For this reason, transducers or resonators that are used in the reactance filters should, have the largest possible real component of the input admittance at their resonant frequency. In previously known transducers, however, a portion of the energy of the acoustic wave is lost, especially because the almost rectangular excitation profile in the transducer diverges from the existing energy density profile of the wave, so that as a result of poor fit of the excitation to the actual energy distribution, the electrically excited acoustic wave can only be partially converted to an electric signal, which is why signal losses occur.

The (lateral or transverse) profile of a physical variable describes the distribution of this variable as a function of the corresponding local coordinates, the x and y axes respectively being selected as the lateral and transverse directions. The energy density profile is here particularly defined as the decrease in energy density in boundary regions compared with a centrally located region.

The energy density profile in a transducer or resonator can be determined by means of power compatibility measurements, for example, where the migration of the electrode material can be a measure of energy density at a given location.

It is known that the longitudinal excitation profile can be adjusted by transverse weighting of the aperture, the aperture being selected to be at its maximum in the center of the transducer and decreased toward the exterior. However, such weighting of the aperture reduces the active region in which the acoustic wave is excited. Moreover, the energy density profile, which is partly attributable to edge effects, is emphasized in the transverse direction, because the longitudinal length of a transducer which is configured as a resonator is generally considerably greater than its transverse length. The edge effects and the associated losses play an increasingly important role as apertures become smaller and smaller.

It is possible to adjust the transverse excitation profile, i.e., the amplitude $A(y)$ of the acoustic wave, which depends on the transverse coordinate y, to the transverse energy density profile $E(y)$ by tapering the fingers toward the bus bar so that the amplitude of the excited wave in the edge region decreases in comparison with the centrally located active region. The disadvantage of this solution is that the finger resistance increases with the smaller finger width. Furthermore, the minimum width of the metal structures is technologically limited, which is especially problematic with transducers or resonators designed for higher frequencies.

Another possibility for adjusting the excitation profile to the energy density profile consists of making the fingers wider in the direction of the bus bar, which would however lead to the excitation of damaging bulk waves and therefore to an increase in losses.

SUMMARY

The goal of the present invention is to disclose an electroacoustic transducer for a component operating with surface waves, in which the losses at the resonant frequency of the transducer are minimal.

The goal of the invention is achieved with an electroacoustic transducer according to claim 1. Advantageous embodiments of the invention can be inferred from the additional claims.

The invention discloses an electroacoustic transducer for a component operating with surface waves, said transducer having a first electrode and a second electrode preferably having alternating, interlocking fingers. The first and/or the second electrode comprises a first and/or a second bus bar, to which the respective fingers are connected. The electrode, in particular, has longer fingers serving to excite the acoustic wave in the active region of the transducer as well as significantly shorter stub fingers, with a longer finger of an electrode being arranged opposite the stub finger of the opposite electrode in a transverse direction, and a gap being arranged between the free (facing away from the respective bus bar) ends of the fingers or stub fingers. The gap is thus the space between the finger and the opposing stub finger. In the following, the position of the gap center relative to the coordinate origin of the transverse axis (y-axis), which can, for example, correspond to the edge of the bus bar facing inward toward the fingers, is referred to as the transverse position of a gap.

According to the invention, the gap position is varied across the length of the transducer. The aforesaid variation is limited to the transverse edge regions of the transducer. The transverse dimension of the edge region is comparable in size to the active region, especially in the case of a short transverse length (aperture) of said active region.

In the transducer, an acoustic wave of wavelength $\lambda$ is excitable at the resonant frequency, said acoustic wave having a longitudinal and a transverse excitation profile, on the one hand, and a longitudinal and a transverse energy density profile, on the other hand. The energy density then decreases toward the bus bars. The longitudinal excitation profile, that is the course of the amplitude $A(x)$ of the wave in the longitudinal direction, is approximately constant and diverges outward from the longitudinal energy density profile $e(x)$.

According to the invention, the position of the gap located in proximity to the respective bus bar varies relative to the setting of the transverse excitation profile, with the transverse excitation profile $A(y)$ and the transverse energy density profile $e(y)$ essentially corresponding to one another.

The transducer of the invention is advantageous in comparison with previously known transducers for components operating with acoustic surfaces in that, as a result of the adjustment of the excitation profile to the existing energy density profile by means of variation of the gap position, optimal energy transfer is achieved, thereby reducing losses caused by exciting the wave in regions with a lower energy density.

In the preferred embodiment of the transducer of the invention, several finger groups are provided in the longitudinal direction, and an active region with a transverse length $W>3\lambda$ and with no gaps is provided in the transverse direction. Edge regions are located between the active region and the bus bars. The active region and the edge regions each have excitation zones in which fingers of opposite polarity face one another in the longitudinal direction, the number of the excitation zones in a finger group corresponding to the number of polarity changes of the fingers.

The active region of a finger group has, in the longitudinal direction, a number N of excitation zones located adjacent to one another, where $N \geq 2$. The relative transverse positions $y_k$ of the centers of the gaps in a finger group located in proximity to the respective bus bar can assume a number M of different values, k being a whole number from 1 to M and $2 \leq M \leq N/2$. The respective edge region has a transverse length $D=y_M-y_1$, where $\lambda<D<W$. The edge region of a finger group comprises a number (M−1) of edge tracks, each being located between two transverse, adjacent gap positions $y_k$ and $y_{k+1}$. The number of excitation zones of an edge track in a finger group is smaller than N and, in the case of several edge tracks, decreases toward the bus bars.

The width of the edge tracks in a finger group can vary. The number M of variations in the gap position, the transverse length D of the edge region, the width of the edge tracks, the number of fingers, the number of excitation zones in the active region or the edge region can vary from group to group. In addition, the gap length, the finger width and the shape of the gap can vary within a finger group or from group to group.

The variation in the transverse positions of the gaps preferably occurs periodically in the longitudinal direction. The variation in the size and/or shape of the gaps in the longitudinal direction can also occur periodically.

In another advantageous variant of the invention, one or more floating metal structures, which are preferably configured as metal strips, are located in each of the gaps. The floating metal structures are preferably located in proximity to the bus bars on both sides of the transducer. The excitation intensity is reduced in an edge region formed in this manner, in that the voltage applied to the electrodes of the transducer is distributed across the "capacity cascade."

According to the invention, it can be provided that at least a portion of the fingers are combined into groups with a predetermined number of at least four fingers per group, so that each finger group extends across a length of at least two wavelengths, each finger group having a pattern with respect to the relative transverse position, size and/or shape of the gaps and/or the metal structures located in the gaps. The patterns in all groups then match, at least to a substantial extent, but they can also be displaced relative to one another with respect to their absolute transverse location in the transducer. It is also possible to vary the respective patterns from group to group, the variation across all groups being periodic.

A periodic variation with respect to the transverse position and/or size of the gaps can be designed to be sinusoidal, triangular or semi-circular.

A number of finger groups can be divided into subgroups, each having a subgroup pattern, with at least two different subgroup patterns occurring in alternating fashion within each finger group, each occurring at least once per finger group.

It is also provided that the pattern of the gap positions in a finger group of the subgroup pattern comprises a linear variation of the transverse position and/or the size of the gaps in the direction of wave propagation or a combination of several linear variations.

It is also possible for the electrode to have split fingers at specific locations. It is also possible to reverse the connection sequence of the fingers at the first and the second electrode for individual fingers. In this case, individual fingers that are adjacent to one another in the active region are connected to the same electrode, that is, the corresponding excitation zones are eliminated.

In another embodiment of the invention, finger widths and/or distances between fingers can increase in the longitudinal direction and/or change, regularly or irregularly, in the transverse direction.

The relative transverse position, size and/or shape of the gaps in the region of opposing finger ends can vary independently of one another across the longitudinal length of the transducer.

A transducer of the invention can be constructed of cascading transducers with sub-transducers connected in series.

The transducer of the invention can, for example, be placed on a piezoelectric substrate of quartz, lithium niobate, lithium tantalate or langasite.

The transducer of the invention can be used in a DMS filter (Double Mode Surface Acoustic Wave filter), a TMR filter (TMR=Transversal Mode Resonator) or a SPUDT resonator (SPUDT=Single Phase Unidirectional Transducer).

In the following, the invention is described in greater detail on the basis of schematic figures which are therefore not true to scale.

DETAILED DESCRIPTION

Figure 1:
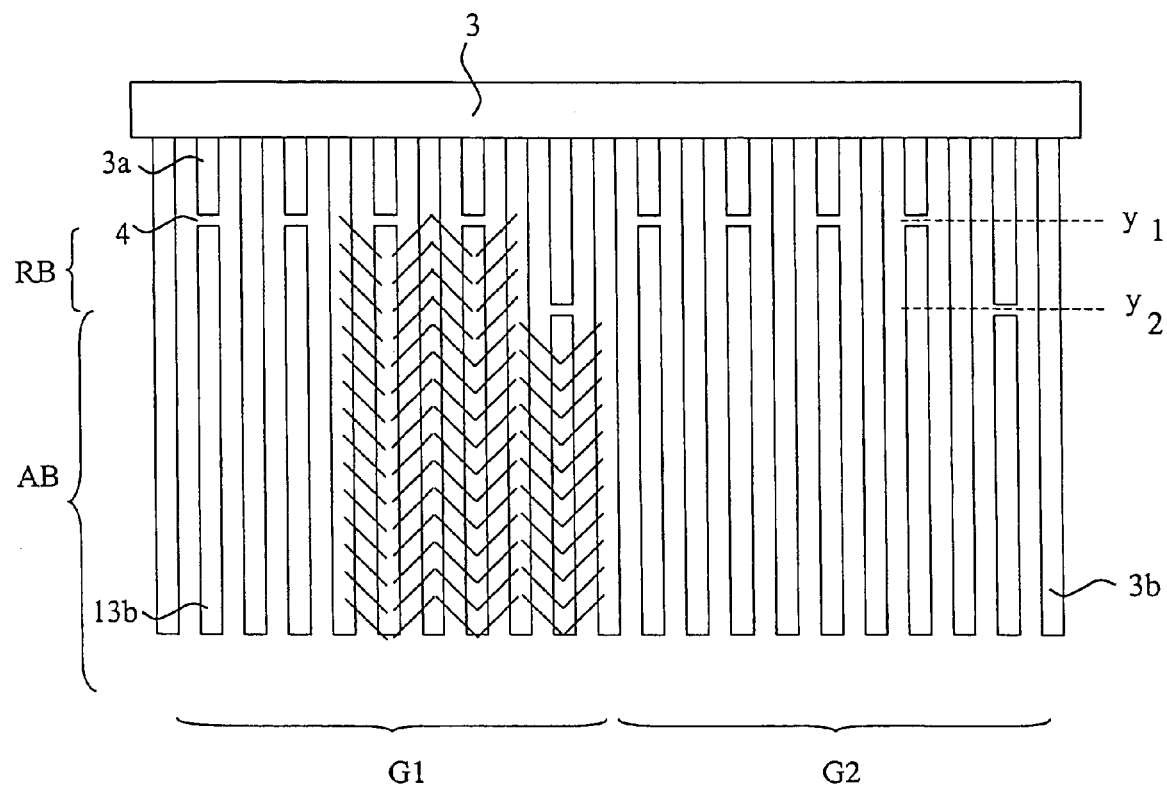
FIGS. 1 to 4 show advantageous embodiments of a transducer of the invention, with a variation in the transverse position of the gaps

FIG. 1 shows a simple embodiment of the invention. A section of a transducer executed as a normal finger transducer in the region of a first bus bar 3 is shown. Fingers 3b and stub fingers 3a designed to excite the acoustic wave are connected to the first bus bar 3. The comb-like structure formed in this manner constitutes a first electrode. The fingers 3b of the first electrode are arranged alternately with fingers 13b of a second electrode, which is only partially depicted here.

This transducer has two fingers 3b, 13b per wavelength. Two electrode fingers of different polarity, which are adjacent to one another, respectively form an excitation zone in their (transverse) overlapping region; for exemplary purposes, a few of said fingers are indicated in FIG. 1 as an area of diagonal dashed lines. The transducer is divided into transverse regions that differ from one another in terms of the number of excitation zones. The number N of the excitation zones in a selected transverse region (edge region or active region) of a group corresponds to the number of polarity changes from finger to finger, which, in normal finger transducers, corresponds to number of fingers in a group. The transverse region of a finger group with the largest (maximum number) of excitation zones is referred to as the active region AB. The transversal regions that are located between the active region AB and the first and/or second bus bar and have a smaller number of excitation zones per finger group are referred to as edge regions. An edge region can consist of one or more edge tracks of the same or different transverse length.

The transverse length W of the active region amounts to at least three wavelengths $\lambda$. The transverse length D of the edge region preferably lies between $\lambda$ and W.

The transducer which is described varies across its length with regard to the transverse gap positions, the gap positions (i.e., the position of the gap center, measured from the inner edge of the first bus bar 3) having two different values $y_1$ and $y_2$. Together, the gap positions $y_1$ and $y_2$ define an edge track of an edge region RB. The transverse length D of the edge region, i.e., the length by which the gaps 4 are offset relative to one another, is then $D=|y_2-y_1|$. Ten fingers form a group G1, G2. The finger group features a pattern with regard to the variation in gap positions; in this case, four gaps with gap position $y_1$ and one gap with gap position $y_2$. This pattern is periodic in the lateral direction. The active region AB has ten excitation zones per finger group, and the edge region RB has eight excitation zones per finger group. Therefore, in this example, the amplitude of the wave excited in the edge region RB is 4/5 of the amplitude of the wave excited in the active region AB.

In the variation of the gap position specified here, the excitation profile A(x) remains approximately constant in the lateral direction, with the exception of minor periodic changes.

Figure 2:
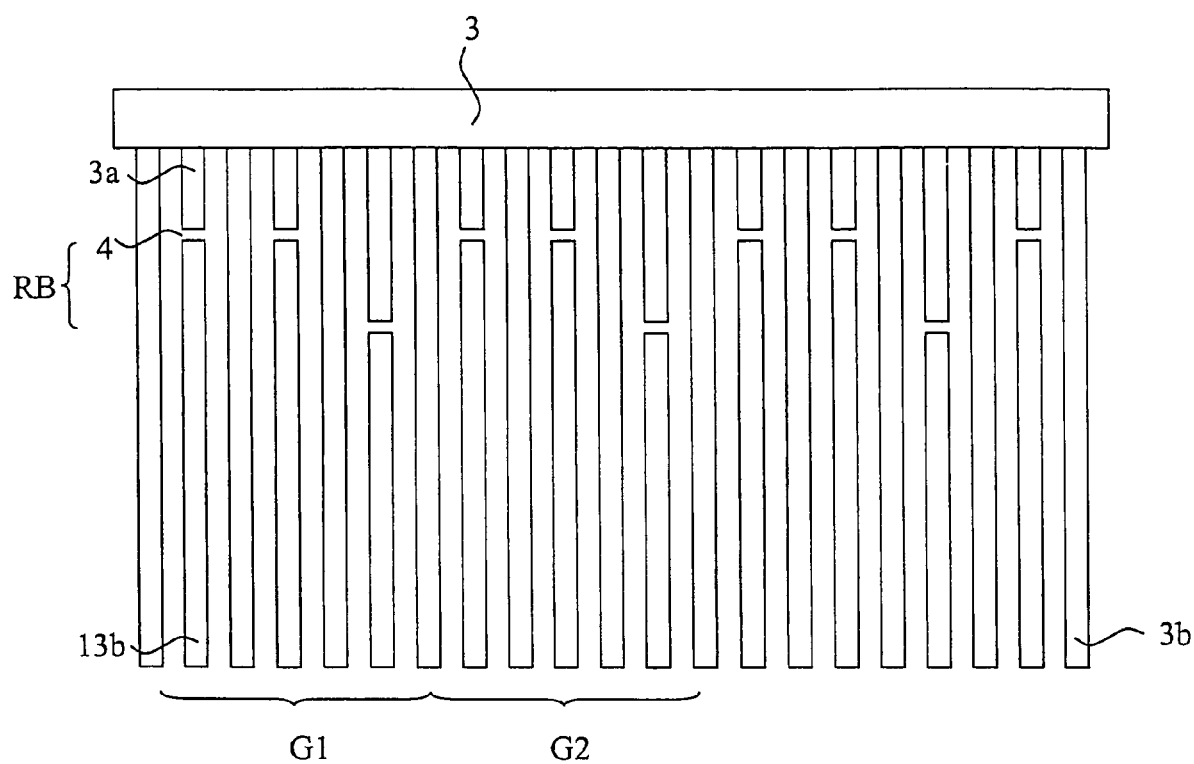

FIG. 2 shows another advantageous embodiment of a transducer of the invention, with a variation of the transverse gap positions. Each finger group G1, G2 comprises six fingers. The number of excitation zones in the edge region RB is equal to four, which corresponds to 2/3 of the amplitude of the acoustic wave excited in the active region.

Figure 3:
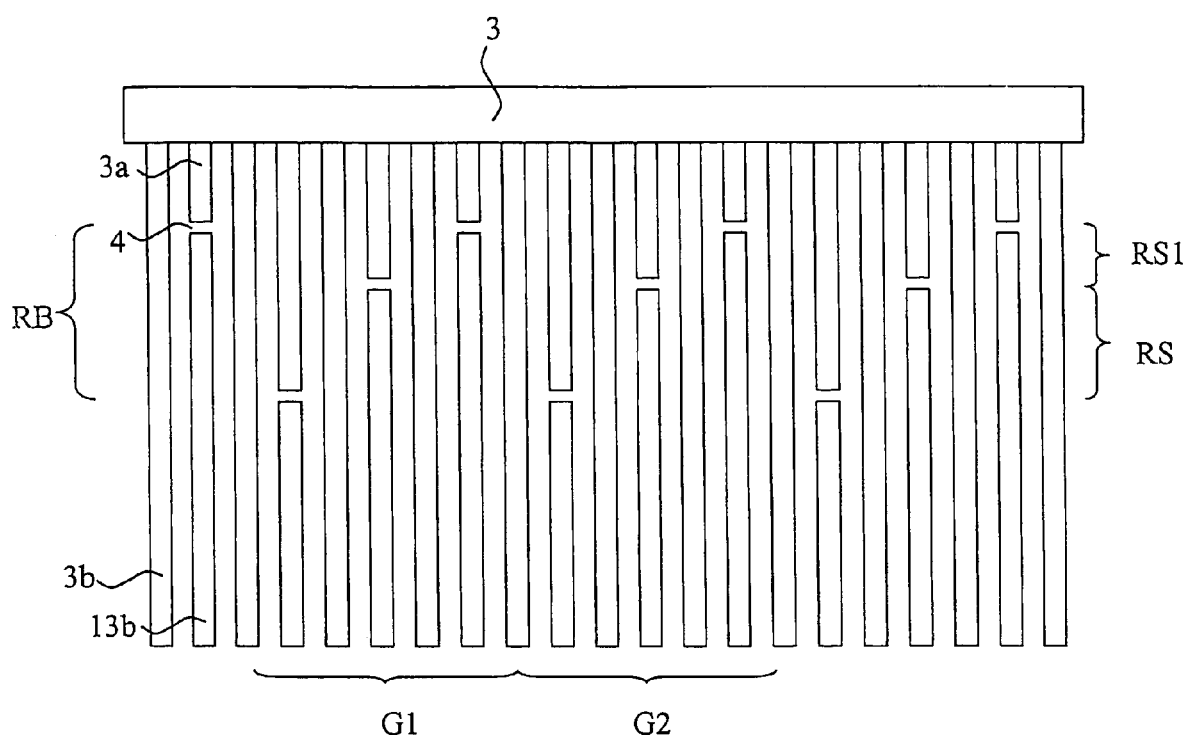

The edge region RB of the variant of a transducer of the invention shown in FIG. 3 features a number M=3 of gap positions provided in a finger group G1, G2 and, correspondingly, two edge tracks RS and RS1. In this case, different widths are selected for the edge tracks RS and RS1. The finger groups G1, G2, which are identical in this case, each comprise six fingers. The number of excitation zones in the edge tracks RS and RS1 is 4 and 2 respectively, which corresponds to 2/3 and 1/3 of the amplitude of the acoustic wave excited in the active region.

The pattern of the transverse gap arrangement as well as the number of fingers in a finger group can vary from group to group.

Figure 4:
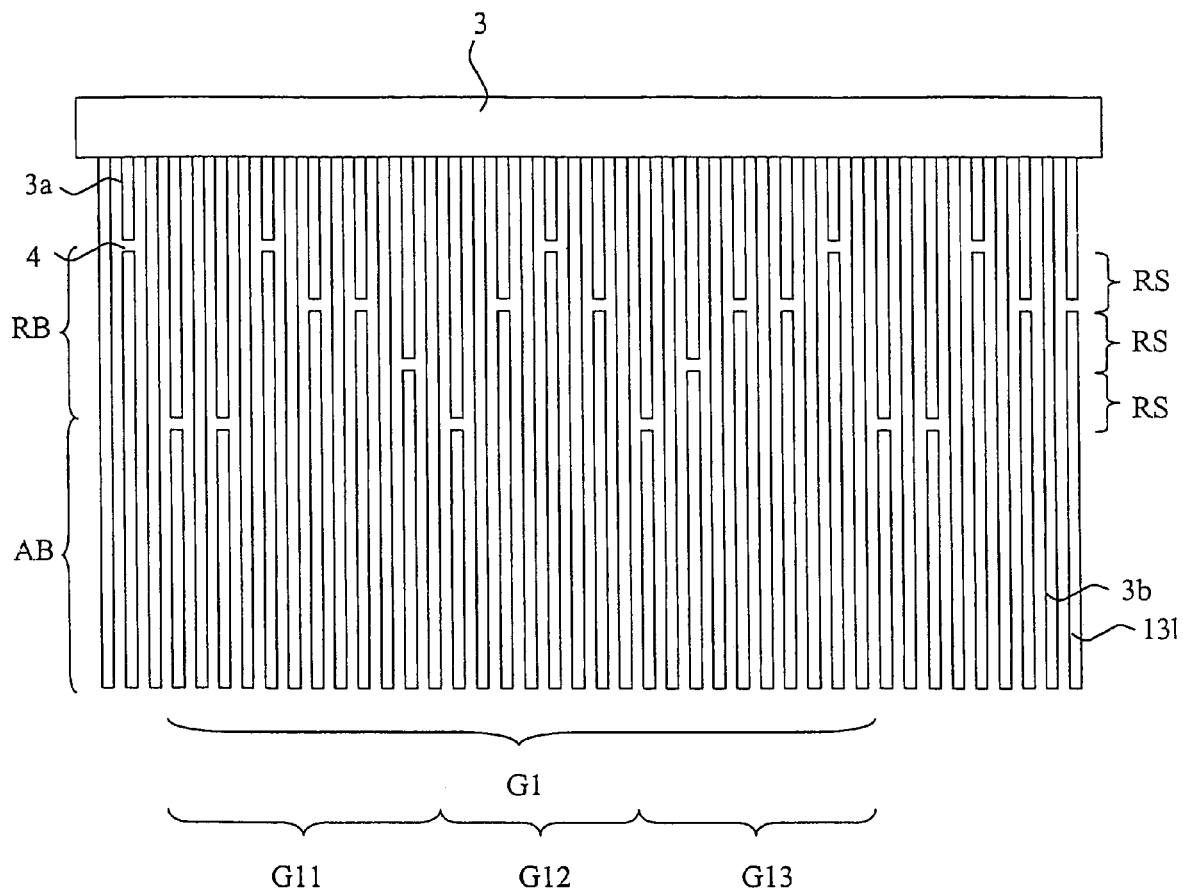

The number of gaps for a specific gap position $y_k$, k being a whole number from 1 to M, can also be greater than 1 in a finger group, as indicated in FIG. 4. The transducer partially shown in FIG. 4 has several finger groups, which are preferably identical with group G1, the relatively large group G1 being divided into smaller subgroups G11, G12 and G13 with different patterns of transverse gap arrangements and/or different numbers of fingers.

The edge region RB of a finger group G1 or a subgroup G11, G12 and G13 has three edge tracks RS, RS1 and RS2, which, in this case, are selected to be approximately equal in the transverse direction. In the edge tracks RS, RS1 and RS2 of the edge region RB, the relative excitation intensity decreases from the active region AB toward the bus bar 3 at a ratio of 5/6, 3/6 and 1/6.

Figure 5A:
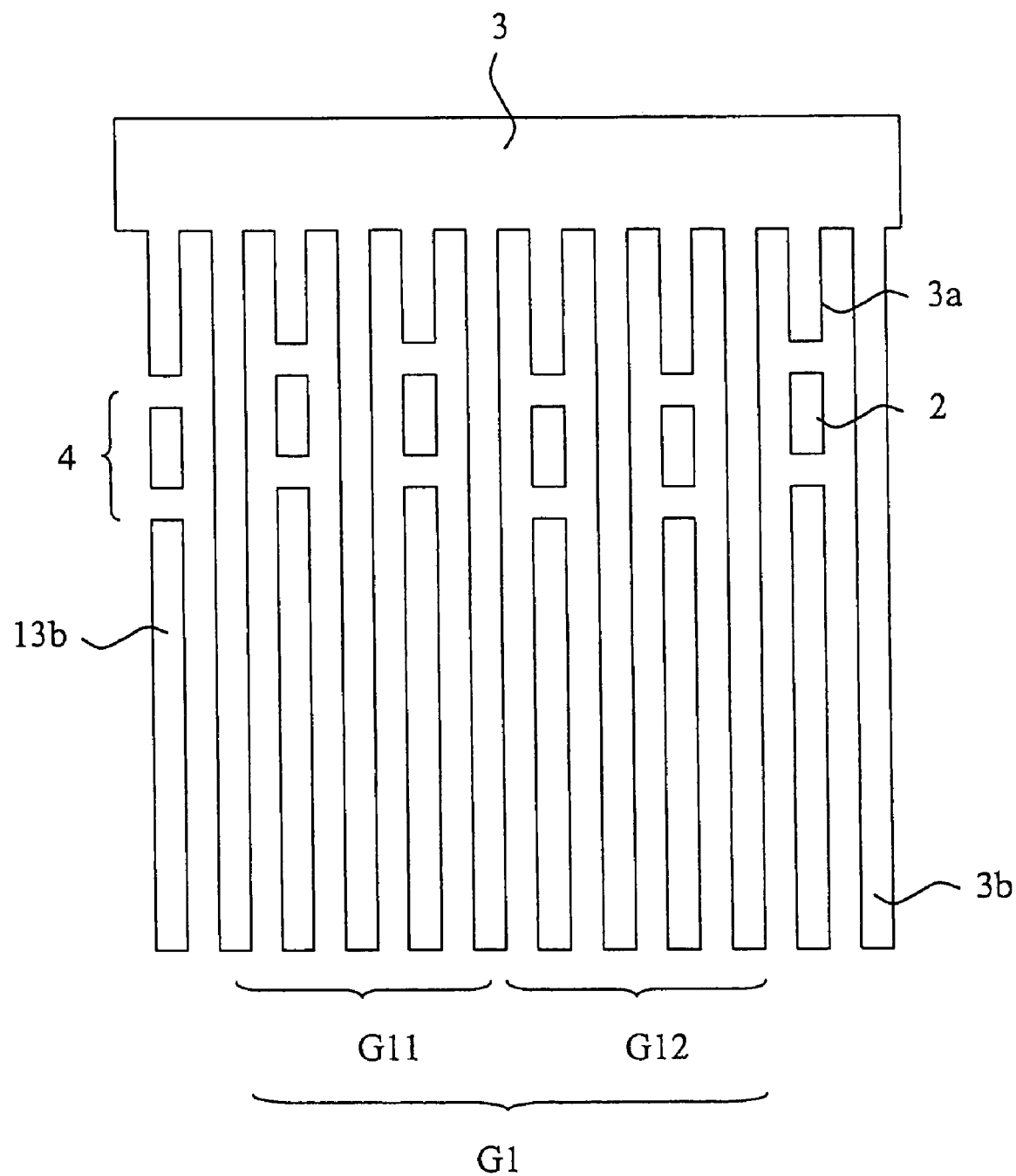
FIGS. 5a, 5b and 6 show advantageous embodiments of a transducer of the invention, with floating metal structures located in the gaps

FIG. 5a and/or 5b shows a segment, depicting only the relevant areas, of an advantageous embodiment of a transducer of the invention with floating (i.e., not electrically connected) metal structures 2 arranged in the gaps 4. The metal structures 2 form a "capacity cascade" between the ends of the fingers of the first and the second electrode, so that the excitation intensity in the edge region RB decreases in comparison with the active region AB.

The transverse arrangement of the gap centers and the metal structures 2 in subgroup G12 is identical with the same type of arrangement in subgroup G11, with the exception of a translational shift in the transverse direction. The subgroups G11 or G12 are arranged alternately in the lateral direction.

Figure 5B:
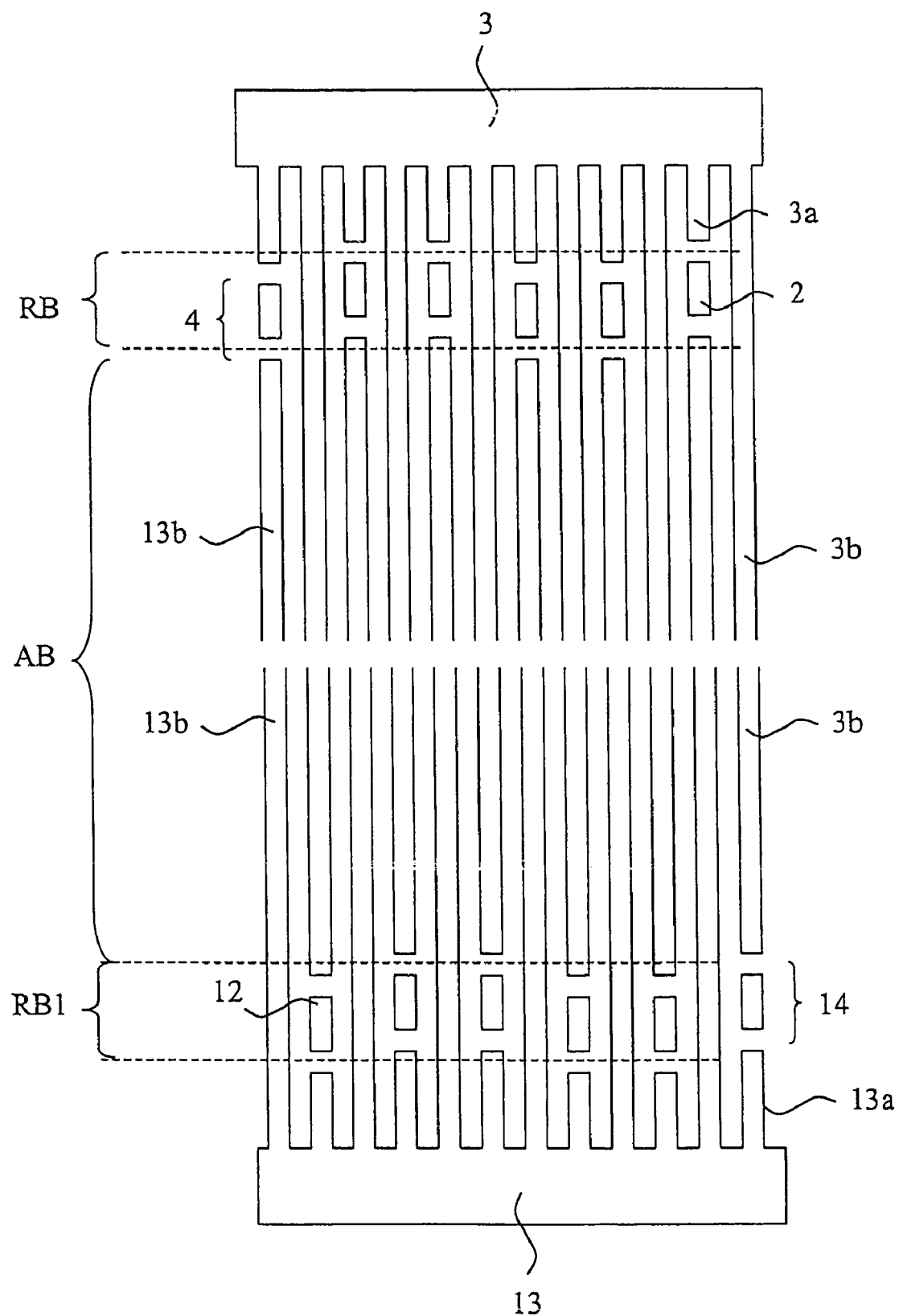

In the preferred variant of the invention, a second edge region RB1, arranged between the active region AB and the second bus bar 13, is identical with the first edge region RB described above (see FIG. 5b). However, in cases of strongly differing transducer environments on different sides, it can also be advantageous to structure the variation in the gaps on both sides to be correspondingly different.

Fingers 13b and stub fingers' 13a are connected to the second bus bar 13. Floating metal structures 12 are provided in the gaps 14 located in proximity to the second bus bar 13.

Figure 6:
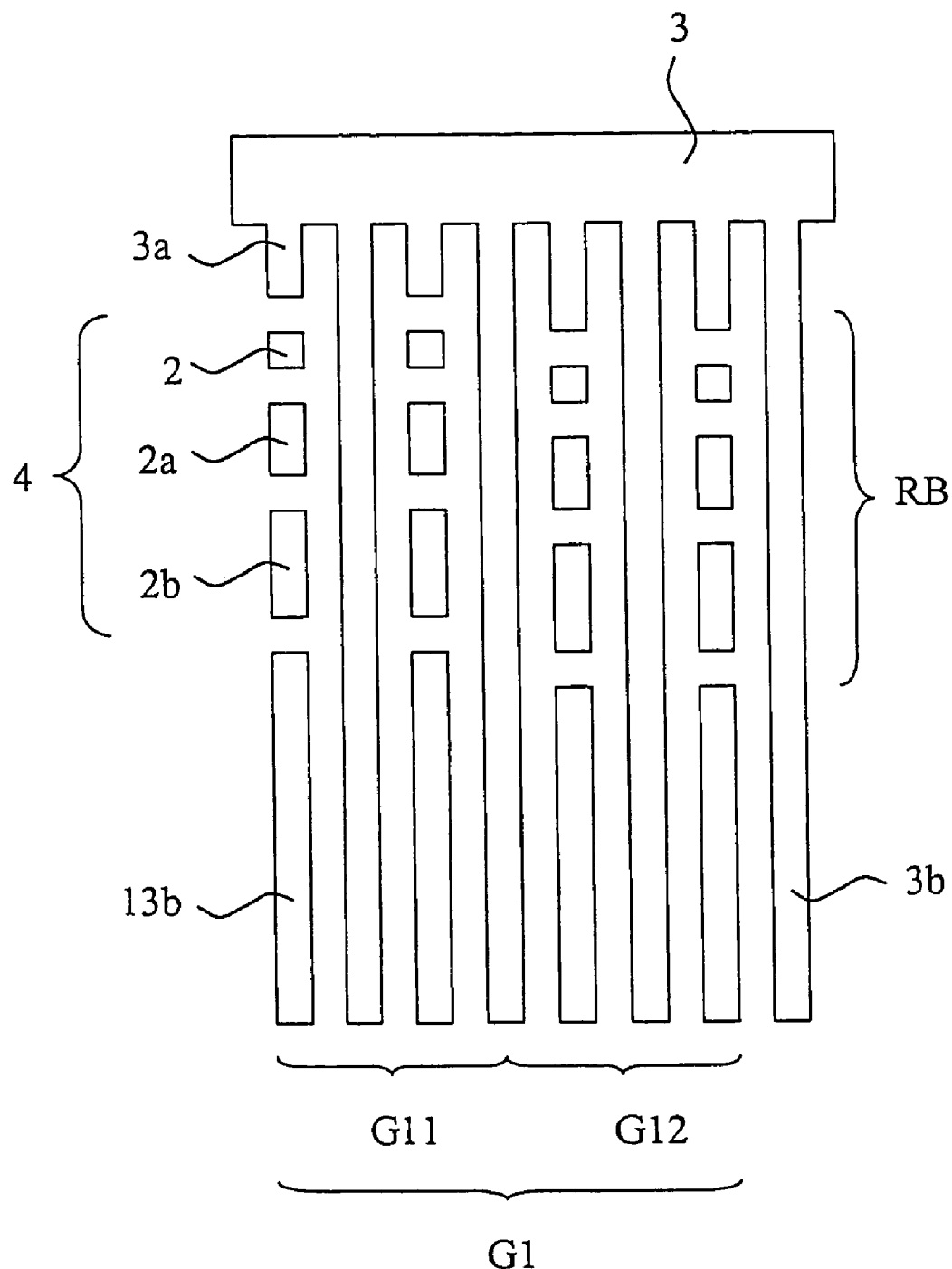

A further example embodiment of the invention is shown in FIG. 6. Here, several floating metal structures 2, 2a and 2b are shown in the gaps 4. The arrangement of the subgroups G11, G12 is identical with that in FIG. 5a.

For the sake of simplicity, the invention was described only on the basis of a few embodiments, but it is not limited to these. Further possible variation arise, in particular, from the possible combination of the designs presented above. The size, shape and/or the transverse gap positions can also be varied independently of one another. The invention is not limited to a specific frequency range or a specific field of application.

The invention claimed is:

1. An electroacoustic transducer comprising:
   a first electrode having first fingers connected to a first bus bar;
   a second electrode having second fingers connected to a second bus bar, wherein the first and second fingers interdigitate;
   an active region and edge regions, the edge regions being between the active region and one of the bus bars;
   wherein at least one end of each of the first and second fingers abuts at least one of plural gaps; and
   at least one floating metal structure in each of the gaps;
   wherein an acoustic wave of wavelength $\lambda$ is excitable at a resonant frequency, the acoustic wave having a longitudinal and a transverse excitation profile and a longitudinal and a transverse energy density profile, the longitudinal excitation profile being approximately constant and different from the longitudinal energy density profile, and the transverse excitation profile substantially corresponding to the transverse energy density profile;

wherein the active region has a transverse length W, where W is at least 3λ;

wherein an edge region has a transverse length D, where λ<D<W; and wherein transverse positions of the gaps relative to a bus bar vary in order to obtain the transverse excitation profile.

2. The electroacoustic transducer of claim 1, wherein the first fingers and the second fingers are configured as finger groups in a longitudinal direction;

wherein W>3λ;

wherein the active region and the edge regions each have excitation zones in which fingers having opposite polarity are adjacent to one another in the longitudinal direction;

wherein, in a finger group, the active region has a number N of excitation zones that are adjacent to one another in the longitudinal direction, where N≧2;

wherein relative transverse positions of centers of gaps in a finger group have a number M of different values $y_k$, k being a whole number from 1 to M, where 2≦M≦N/2;

wherein D=$y_M$-$y_1$;

wherein an edge region of a finger group comprises a number M-1 of edge tracks, the edge tracks being between two gap positions $y_k$ and $y_{k+1}$ that are transverse and adjacent, k being an integer from 1 to M-1; and wherein a number of excitation zones of an edge track in a finger group is less than N and, in a case of plural edge tracks, the number of excitation zones per track is less for a track closer to the bus bar.

3. The electroacoustic transducer of claim 1, wherein variations in transverse positions of the gaps occur periodically in a longitudinal direction.

4. The electroacoustic transducer of claim 1, wherein at least some of the gaps vary in at least one of size and shape.

5. The electroacoustic transducer of claim 3, wherein variation in the size and the shape of the gaps occurs in a longitudinal direction and occurs periodically.

6. The electroacoustic transducer of claim 1, comprising a plurality of edge tracks, the edge tracks having different widths.

7. The electroacoustic transducer of claim 1, wherein the at least one floating metal structure comprises floating metal structures in proximity to both the first and second bus bars.

8. The electroacoustic transducer of claim 1, wherein at least one of transverse position, size and shape of the gaps vary periodically in a pattern that is one of sinusoidal, triangular and semi-circular.

9. The electroacoustic transducer of claim 1, wherein at least one of the first and second fingers is split.

10. The electroacoustic transducer of claim 1, wherein at least two of first fingers are adjacent to each other.

11. The electroacoustic transducer of claim 1, wherein at least one of a width of individual first and second fingers and a distance between individual first and second fingers increases in a longitudinal direction.

12. The electroacoustic transducer of claim 1, wherein at least one of a width of individual first and second fingers and a distance between individual first and second fingers is different in a transverse direction, the widths and distances being different in a pattern that is regular.

13. The electroacoustic transducer of claim 1, wherein at least one of a relative position, size and shape of the gaps varies in proximity to the first bus bar and in proximity to the second bus bar.

14. The electroacoustic transducer of claim 1, further comprising sub-transducers connected in series.

15. The electroacoustic transducer of claim 1, further comprising a piezoelectric substrate, the piezoelectric substrate comprising at least one of quartz, lithium niobate, lithium tantalate and langasite.

16. A DMS filter comprising the electroacoustic transducer of claim 1.

17. A TMR filter comprising the electroacoustic transducer of claim 1.

18. The electroacoustic transducer of claim 1, wherein at least one of a width of individual first and second fingers and a distance between individual first and second fingers varies in a transverse direction, the widths and the distances being different, respectively, in a pattern that is irregular.

19. The electroacoustic transducer of claim 1, wherein the first and second fingers comprise finger groups comprised of at least four fingers, each finger group spanning a length of at least two wavelengths, wherein the finger groups each comprise subgroups, each subgroup having a subgroup pattern, at least two different subgroup patterns alternating within each finger group, each subgroup pattern occurring at least once per finger group.

20. The electroacoustic transducer of claim 19, wherein each finger group has a finger group pattern comprised of at least one of transverse position size and shape of at least one of the gaps and the floating metal structures, and wherein at least one of a finger group pattern and a subgroup pattern corresponds to a linear variation in a longitudinal direction of at least one of a transverse position and size of the gaps.

21. An electroacoustic transducer comprising:

a first electrode having first fingers connected to a first bus bar;

a second electrode having second fingers connected to a second bus bar, wherein the first and second fingers interdigitate;

an active region and edge regions, the edge regions being between the active region and one of the bus bars;

wherein at least one end of each of the first and second fingers abuts at least one of plural gaps; and floating metal structures in at least some of the gaps;

wherein an acoustic wave of wavelength λ is excitable at a resonant frequency, the acoustic wave having a longitudinal and a transverse excitation profile and a longitudinal and a transverse energy density profile, the longitudinal excitation profile being approximately constant and different from the longitudinal energy density profile, and the transverse excitation profile substantially corresponding to the transverse energy density profile;

wherein the active region has a transverse length W, where W is at least 3λ;

wherein an edge region has a transverse length D, where λ<D<W;

wherein transverse positions of the gaps relative to a bus bar vary in order to obtain the transverse excitation profile;

wherein the first and second fingers comprise finger groups comprised of at least four fingers, each finger group spanning a length of at least two wavelengths;

wherein each finger group has a finger group pattern comprised of at least one of transverse position size and shape of at least one of the gaps and the floating metal structures, the finger groups comprising a first finger group and a second finger group;

wherein finger group patterns of the first group and the second group substantially coincide; and wherein the finger group pattern of the first and the second finger group are displaced with respect to one another in a transverse direction.

22. The electroacoustic transducer of claim 21, wherein the finger groups each comprise subgroups, each subgroup having a subgroup pattern, at least two different subgroup patterns alternating within each finger group, each subgroup pattern occurring at least once per finger group.

23. The electroacoustic transducer of claim 22, wherein at least one of a finger group pattern and a subgroup pattern corresponds to a linear variation in a longitudinal direction of at least one of a transverse position and size of the gaps.

24. An electroacoustic transducer comprising:
a first electrode having first fingers connected to a first bus bar;
a second electrode having second fingers connected to a second bus bar, wherein the first and second fingers interdigitate;
an active region and edge regions, the edge regions being between the active region and one of the bus bars;
wherein at least one end of each of the first and second fingers abuts at least one of plural gaps; and
floating metal structures in at least some of the gaps;
wherein an acoustic wave of wavelength $\lambda$ is excitable at a resonant frequency, the acoustic wave having a longitudinal and a transverse excitation profile and a longitudinal and a transverse energy density profile, the longitudinal excitation profile being approximately constant and different from the longitudinal energy density profile, and the transverse excitation profile substantially corresponding to the transverse energy density profile;
wherein the active region has a transverse length W, where W is at least $3\lambda$;
wherein an edge region has a transverse length D, where $\lambda<D<W$;
wherein transverse positions of the gaps relative to a bus bar vary in order to obtain the transverse excitation profile;
wherein the first and second fingers comprise finger groups comprised of at least four fingers, each finger group spanning a length of at least two wavelengths;
wherein each finger group has a finger group pattern comprised of at least one of transverse positions, sizes and shapes of at least one of the gaps and the floating metal structures;
wherein the finger group patterns in all finger groups substantially coincide; and
wherein variations in the finger group pattern occur periodically in a longitudinal direction.

* * * * *